(12) United States Patent
Shu et al.

(10) Patent No.: US 11,778,916 B2
(45) Date of Patent: Oct. 3, 2023

(54) MATCHING CONTROL METHOD FOR MECHANICAL IMPEDANCE OF MAGNETOSTRICTIVE PRECISION TRANSDUCER

(71) Applicant: Wenzhou University, Zhejiang (CN)

(72) Inventors: Liang Shu, Wenzhou (CN); Yeheng Zhang, Wenzhou (CN); Bo Li, Wenzhou (CN); Dingfang Chen, Wenzhou (CN); Quanguo Lu, Wenzhou (CN); Marcelo J. Dapino, Wenzhou (CN); Menglun Tao, Wenzhou (CN); Yanchao Zhu, Wenzhou (CN)

(73) Assignee: WENZHOU UNIVERSITY, Zhejiang (CN)

( * ) Notice: Subject to any disclaimer, the term of this patent is extended or adjusted under 35 U.S.C. 154(b) by 616 days.

(21) Appl. No.: 17/012,074

(22) Filed: Sep. 4, 2020

(65) Prior Publication Data
US 2021/0159386 A1    May 27, 2021

(30) Foreign Application Priority Data

Nov. 22, 2019  (CN) .......................... 201911155725.7

(51) Int. Cl.
*H10N 35/80*     (2023.01)
*H10N 35/00*     (2023.01)
(Continued)

(52) U.S. Cl.
CPC .............. *H10N 35/80* (2023.02); *G06N 3/04* (2013.01); *G06N 3/08* (2013.01); *H10N 35/00* (2023.02)

(58) Field of Classification Search
CPC ........ H10N 35/80; H10N 35/00; H10N 35/01; H10N 35/101; H10N 30/80; G06N 3/04;
(Continued)

(56) References Cited

U.S. PATENT DOCUMENTS

| 6,984,902 B1 * | 1/2006 | Huang | ................... H10N 30/00 |
| | | | 73/861.77 |
| 10,809,315 B2 * | 10/2020 | Zhou | ................... G01R 35/005 |

(Continued)

FOREIGN PATENT DOCUMENTS

| CN | 102645298 A | * | 8/2012 |
| CN | 102721490 A | * | 10/2012 |

(Continued)

*Primary Examiner* — Edgardo San Martin
(74) *Attorney, Agent, or Firm* — Leong C. Lei (57) ABSTRACT

A matching control method for mechanical impedance of a magnetostrictive precision transducer includes developing a three-layer neural network model corresponding to a Young's modulus of a Terfenol-D material; acquiring sample data to form a training sample set and a testing sample set; training the model using a Bayesian regularization training algorithm, and optimizing connection weights and thresholds among layers of the tested model, so as to obtain a final three-layer neural network model; based on the final model, building an inverse model of mechanical impedance of the magnetostrictive precision transducer; using a current level of impedance of a load as an input of the inverse model to obtain a bias magnetic field, and changing a level of the bias magnetic field by changing a bias current in an excitation coil of the transducer, thereby achieving adaptive matching between the mechanical impedance of the transducer and the impedance of the load.

4 Claims, 10 Drawing Sheets

(51) Int. Cl.
*H02N 2/00* (2006.01)
*H02N 2/04* (2006.01)
*G06N 3/04* (2023.01)
*G06N 3/08* (2023.01)

(58) Field of Classification Search
CPC ............ G06N 3/02; G06N 3/08; G06N 3/047;
G06N 3/082; H02N 2/00; H02N 2/06;
H02N 2/04
See application file for complete search history.

(56) References Cited

U.S. PATENT DOCUMENTS

| | | | | |
|---|---|---|---|---|
| 11,616,393 B2 * | 3/2023 | Youssef | .................. | H02J 50/12 |
| | | | | 307/104 |
| 2021/0159386 A1 * | 5/2021 | Shu | ........................... | G06N 3/08 |
| 2022/0166252 A1 * | 5/2022 | Youssef | ............... | H04B 5/0037 |

FOREIGN PATENT DOCUMENTS

| CN | 103346692 A | * | 10/2013 | | |
|---|---|---|---|---|---|
| CN | 105099263 A | * | 11/2015 | | |
| CN | 206286155 U | * | 6/2017 | | |
| CN | 108167264 A | * | 6/2018 | .......... | F15B 15/1404 |
| CN | 108269249 A | * | 7/2018 | | |
| CN | 108550692 A | * | 9/2018 | ............. | H01L 41/12 |
| CN | 109977557 A | * | 7/2019 | | |
| CN | 110043519 A | * | 7/2019 | | |
| CN | 210775659 U | * | 6/2020 | | |
| EP | 3301426 A1 | * | 4/2018 | ............. | G01L 1/125 |

* cited by examiner

FIG. 1

| using a compressive stress σ and a driving magnetic field strength H as input neurons, and using a Young's modulus E as an output neuron to develop a three-layer neural network model corresponding to a Young's modulus of a Terfenol-D material | S1 |

↓

| acquiring a plurality of sample data from a predetermined original data set, and forming the acquired plural sample data into a training sample set and a testing sample set, respectively, wherein each said sample data has data feature terms consisting of the compressive stress σ, the driving magnetic field strength H and the Young's modulus E | S2 |

↓

| introducing the training sample set into the three-layer neural network model and performing training using a predetermined Bayesian regularization training algorithm, and introducing the testing sample set into the three-layer neural network model for testing, thereby obtaining a trained and tested three-layer neural network model | S3 |

↓

| optimizing connection weights and thresholds among individual layers of the trained and tested three-layer neural network model, thereby obtaining an optimized three-layer neural network model | S4 |

↓

| according to the training sample set and the testing sample set, training and testing the optimized three-layer neural network model, until the optimized three-layer neural network model is converged into a predetermined error index, thereby obtaining a final three-layer neural network model corresponding to the Young's modulus of the Terfenol-D material | S5 |

↓

| based on the obtained final three-layer neural network model corresponding to the Young's modulus of the Terfenol-D material, developing a mechanical impedance model of the magnetostrictive precision transducer | S6 |

↓

| based on the mechanical impedance model of the magnetostrictive precision transducer, developing a matching control network for the mechanical impedance of the magnetostrictive precision transducer, and developing an inverse model that is from the Young's modulus of the Terfenol-D material to a bias magnetic field, thereby obtaining a level of the bias magnetic field required by a target stiffness, and after series compensation between the developed inverse model and the magnetostrictive precision transducer is done, finding a solution to the developed inverse model, so as to obtain the bias magnetic field and input it to the magnetostrictive precision transducer, such that the level of the bias magnetic field can be changed by changing a bias current of a DC bias coil in the magnetostrictive precision transducer and achieving adaptive matching between the mechanical impedance and impedance of a load | S7 |

MATCHING CONTROL METHOD FOR MECHANICAL IMPEDANCE OF MAGNETOSTRICTIVE PRECISION TRANSDUCER

BACKGROUND OF THE INVENTION

1. Technical Field

The present invention relates to magnetostrictive precision transducers, and more particularly to a matching control method for mechanical impedance of a magnetostrictive precision transducer.

2. Description of Related Art

Magnetostrictive transducers use a giant magnetostrictive material (GMM, generally marketed under the trade name of Terfenol-D) as their driving device, which causes magnetostriction in response to application of an external magnetic field and makes the magnetostrictive transducers perform displacement and deformation, thereby achieving conversion between electrical energy and mechanical energy.

The traditional transducers using a piezoelectric material as their driving device are small in mechanical displacement and deformation and low in output, and their driving requires high voltage and in turn a complex peripheral control system. By comparison, magnetostrictive transducers address the shortcomings of the traditional transducers with their nano-scale accuracy in displacement output, 8-10 times higher mechanical extension capacity than piezoelectric materials, fast response, high output, and simple control structure. These benefits pose magnetostrictive transducers at a unique advantageous position in engineering applications. At present, magnetostrictive transducers have become the key driving component in micro-displacement transducers, linear motors, precision processing and active vibration control, and have a vast application prospect in the fields of fluid control, precision mechanical control, high-power sea-land communication, and smart structure for aerospace and defense purposes.

Figure 1:
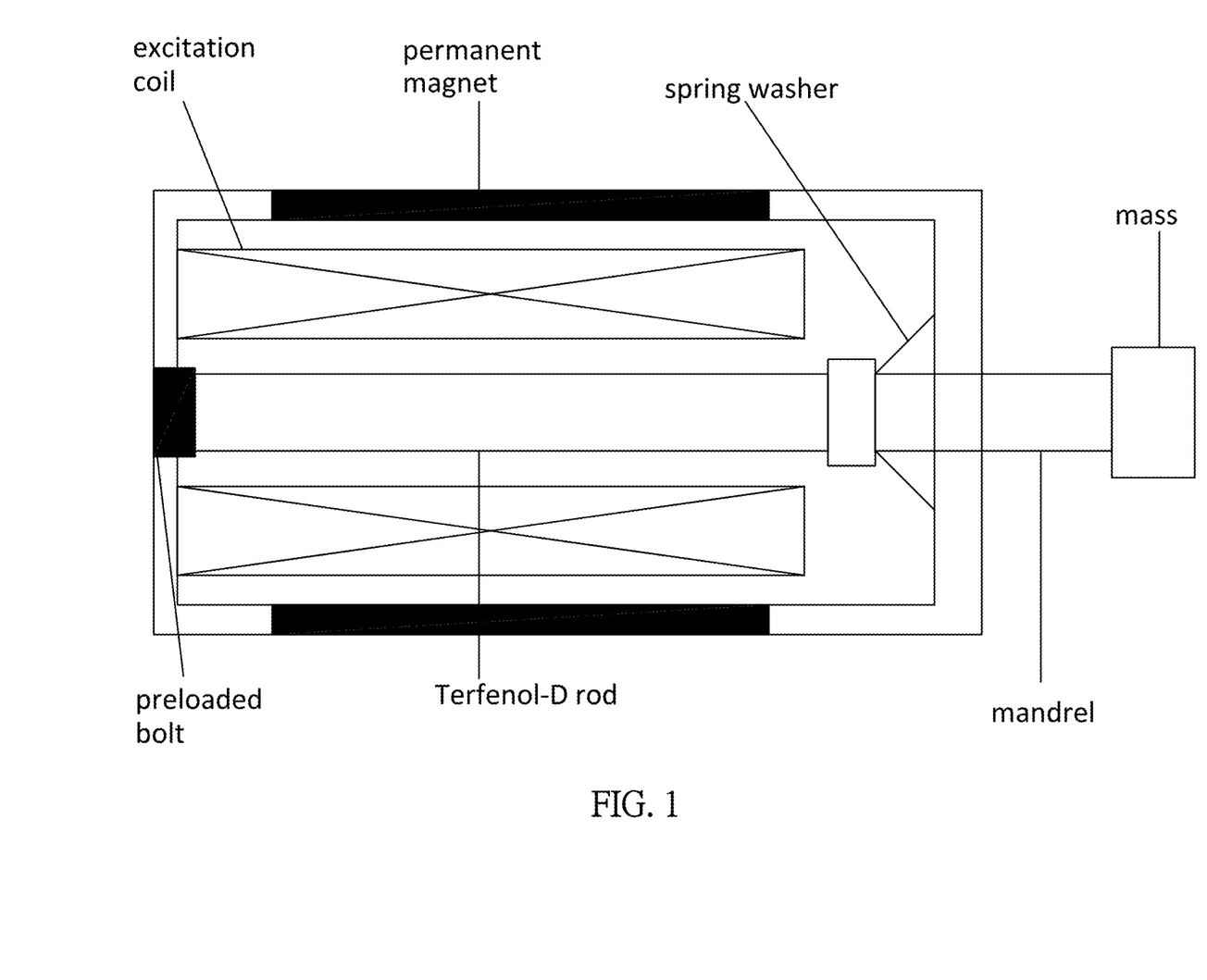
FIG. 1 is a local, cross-sectional structural diagram of an existing magnetostrictive transducer.

FIG. 1 is a local, cross-sectional structural diagram of an existing magnetostrictive transducer. The magnetostrictive transducer includes an excitation coil, a permanent magnet, spring washer, a preloaded bolt, a GMM material (under the trade name of Terfenol-D), a mandrel and a load mass. Therein, the excitation coil provides the transducer with a driving magnetic field during operation, and the permanent magnet provides the Terfenol-D rod with a bias magnetic field, while the spring washer provides the transducer with bias stress, whose intensity may be adjusted by changing the spring stiffness and compression of the spring. The Terfenol-D rod and the displacement output mandrel are connected through a rigid connection, so that the magnetostriction generated by the Terfenol-D rod can be output through the mandrel. In FIG. 1, the mass represents an object. The magnetostrictive transducer works as follows. An excitation current entering the coil leads to generation of the driving magnetic field. In response to the effect of the driving magnetic field, the Terfenol-D rod performs mechanical deformation, and thereby pushes the mandrel to move to output power and displacement. In this process, energy conversion and transfer from the electric field to the magnetic field and then into mechanical energy are accomplished. The permanent magnet in FIG. 1 serves to generate a fixed magnetic field, which makes the frequency of the excitation magnetic field generated by the coil equal to the mechanical movement frequency of the Terfenol-D rod, thereby eliminating the undesirable phenomenon of "frequency multiplication." In view that the Terfenol-D material is relatively brittle and breakable, with a tensile strength as small as 28 Mpa, the preloaded bolt and the spring washer are provided to axially pre-stress and thereby protect the Terfenol-D rod.

In addition, there are studies indicating that proper compressive pre-stress is helpful to increase magnetostriction and thereby enhance conversion efficiency from transducer electromagnetic energy toward mechanical energy. Currently, during operation of a magnetostrictive precision transducer, energy conversion is performed from the electric field to the magnetic field and then to the mechanical field, which is a complex process, leading to low energy utilization. Therefore, how to enhance the conversion efficiency between electromagnetic energy and mechanical energy is a key issue of engineering applications in the field of magnetostrictive precision drive.

Most of the existing magnetostrictive precision transducers adopt fixed stiffness, with the attempt to improve efficiency by minimizing energy transfer stages. For example, some known methods such as optimization of magnetic circuit design and reduction of coil magnetic leakage do facilitate improvement of energy efficiency in transducers to some extent. However, none of these methods is the ultimate solution to the issue.

In fact, the key to maximization of energy efficiency of magnetostrictive precision transducers lays on variable-stiffness, variable-impedance control, instead of fixed-stiffness control, so that adaptive impedance matching between the transducer and the load can be achieved, thereby improving energy conversion efficiency. For a power output system, mechanical impedance matching is of significant influence on energy conversion efficiency. Specifically, the energy conversion efficiency of the system peaks when conjugate impedance matching is achieved between the system and its load.

However, the existing fixed-stiffness approach prevents a precision transducer from changing its internal impedance. Impedance mismatching between the transducer and the load can significantly degrade energy conversion efficiency. Given the fact that Terfenol-D's elastic modulus changes with the current in the excitation coil, it is possible to change the level of the magnetic field by altering the bias current in the coil, so as to actively modulate the internal impedance of the precision transducer and adaptively match it with the impedance of the load.

Therefore, in order to accomplish adaptive matching between the mechanical impedance of a magnetostrictive precision transducer and the impedance of a load, there is a need for a matching control method for mechanical impedance of a magnetostrictive precision transducer that is based on a variable stiffness mechanism, which detects mechanical impedance of a load in a real time manner and at the same time performs closed-loop tracking control on internal mechanical impedance of the system, so as to achieve real-time adaptive matching between the mechanical impedance of the magnetostrictive precision transducer and the impedance of the load, thereby improving energy conversion efficiency of the precision transducer.

SUMMARY OF THE INVENTION

The objective of the present invention is to provide a matching control method for mechanical impedance of a magnetostrictive precision transducer based on a variable stiffness mechanism, which detects mechanical impedance of a load in a real time manner and at the same time performs closed-loop tracking control on internal mechanical impedance of the system, so as to achieve real-time adaptive matching between the mechanical impedance of the magnetostrictive precision transducer and the impedance of the load, thereby improving energy conversion efficiency of the precision transducer.

For achieving the foregoing objective, the present invention provides a matching control method for mechanical impedance of a magnetostrictive precision transducer. The method comprising steps of:

Step S1: using a compressive stress σ and a driving magnetic field strength H as input neurons, and using a Young's modulus E as an output neuron to develop a three-layer neural network model corresponding to a Young's modulus of a Terfenol-D material;

Step S2: acquiring a plurality of sample data from a predetermined original data set, and forming the acquired plural sample data into a training sample set and a testing sample set, respectively, wherein each said sample data has data feature terms consisting of the compressive stress σ, the driving magnetic field strength H and the Young's modulus E;

Step S3, introducing the training sample set into the three-layer neural network model and performing training using a predetermined Bayesian regularization training algorithm, and introducing the testing sample set into the three-layer neural network model for testing, thereby obtaining a trained and tested three-layer neural network model;

Step S4, optimizing connection weights and thresholds among individual layers of the trained and tested three-layer neural network model, thereby obtaining an optimized three-layer neural network model;

Step S5, according to the training sample set and the testing sample set, training and testing the optimized three-layer neural network model, until the optimized three-layer neural network model is converged into a predetermined error index, thereby obtaining a final three-layer neural network model corresponding to the Young's modulus of the Terfenol-D material;

Step S6, based on the obtained final three-layer neural network model corresponding to the Young's modulus of the Terfenol-D material, developing a mechanical impedance model of the magnetostrictive precision transducer; and Step S7, based on the mechanical impedance model of the magnetostrictive precision transducer, developing a matching control network for the mechanical impedance of the magnetostrictive precision transducer, and developing an inverse model that is from the Young's modulus of the Terfenol-D material to a bias magnetic field, thereby obtaining a level of the bias magnetic field required by a target stiffness, and after series compensation between the developed inverse model and the magnetostrictive precision transducer is done, finding a solution to the developed inverse model, so as to obtain the bias magnetic field and input it to the magnetostrictive precision transducer, such that the level of the bias magnetic field can be changed by changing a bias current of a DC bias coil in the magnetostrictive precision transducer and achieving adaptive matching between the mechanical impedance and impedance of a load.

Therein, Step S4 comprises:
setting an input vector P and a target output vector B as:

$$\begin{cases} P = (P_1, P_2 \lfloor P_m) = (\sigma_1, \sigma_2 \lfloor \sigma_m; H_1, H_2 \lfloor H_m) \\ B = (E_1, E_2 \lfloor E_m) \end{cases} \quad (1)$$

where $P_i = (\sigma_i, H_i)$, $i = 1, \ldots, m$;

selecting any group of said data as a sample input network, so that an input vector and an output vector of a hidden layer can be represented by:

$$\begin{cases} \alpha = (\alpha_1, \alpha_2 \lfloor \alpha_n) \\ \beta = (\beta_1, \beta_2 \lfloor \beta_n) \\ \alpha_i = \sum_{i=1}^{m} w_{ij} P_l - \theta_l \quad i = 1, 2, \lfloor m; j = 1, 2, \lfloor n \\ \beta_j = f(\alpha_j) \end{cases} \quad (2)$$

where α is the input vector of the hidden layer, β is the output vector of the hidden layer, $f$ is a transfer function from the input layer to the hidden layer, $w_{ij}$ is a connection weight from the input layer to the hidden layer, and $\theta_j$ is a threshold of the hidden layer;

then from the output vector of the hidden layer, obtaining an input vector and an output vector of an output layer as:

$$\begin{cases} \chi = (\chi_1, \chi_2 \lfloor \chi_n) \\ \delta = (\delta_1, \delta_2 \lfloor \delta_n) \\ \chi_t = \sum_{i=1}^{m} v_{jt} \beta_j - \gamma_t \quad t = 1, 2, \lfloor m \\ \delta_t = L(\chi_t) \end{cases} \quad (3)$$

where χ is the input vector of the output layer, δ is the output vector of the output layer, L is a transfer function from the hidden layer to the output layer, $v_{jt}$ is a connection weight from the hidden layer to the output layer, and $\gamma_t$ is a threshold of the output layer;

next, determining an error of each unit of the output layer and the hidden layer as:

$$\begin{cases} d_t = (E_t - \delta_t)\delta_t(1 - \delta_t) \\ e_j = \left[\sum_{t=1}^{m} d_t v_{jt}\right] \beta_j(1 - \beta_j) \end{cases} \quad (4)$$

where $d_t$ is an error of the output layer, and $e_j$ is an error of the hidden layer; and at last, according to Equation (5), correcting the thresholds and the connection weights of the hidden layer and the output layer, until a global error is smaller than a set value, thereby obtaining the optimized three-layer neural network model;

$$\begin{cases} v_{jt}(N+1) = v_{jt}(N) + \lambda d_t \beta_j \\ \gamma_t(N+1) = \gamma_t(N) + \lambda d_t \end{cases} \quad (5)$$

$$\begin{cases} w_{ij}(N+1) = w_{ij}(N) + \Delta w_{ij}(N) \\ \theta_j(N+1) = \theta_j(N) + \Delta \theta_j(N) \end{cases} ;$$

where $\Delta w_{ij}$ is a variation of the weight of the hidden layer, $\Delta \theta_j$ is a variation of the threshold of the hidden layer, and λ is an error coefficient, $0 < \lambda < 1$.

Therein, Step S6 comprises:
according to a structure of individual components in the magnetostrictive precision transducer, determining a single-DoF dynamic model of the magnetostrictive precision transducer;

based on the single-DoF dynamic model of the magnetostrictive precision transducer, determining a mechanical impedance network of the magnetostrictive precision transducer; and based on the obtained final three-layer neural network model corresponding to the Young's modulus of the Terfenol-D material and the mechanical impedance network of the magnetostrictive precision transducer, using a mechanical impedance method to obtain the mechanical impedance model of the magnetostrictive precision transducer.

Therein, Step S7 comprises:

based on the obtained final three-layer neural network model corresponding to the Young's modulus of the Terfenol-D material, developing the inverse model from the Young's modulus of the Terfenol-D material to the bias magnetic field;

based on the mechanical impedance model of the magnetostrictive precision transducer, developing the matching control network for the mechanical impedance of the magnetostrictive precision transducer, and using sensors to acquire signals related to movements of the load such as displacement, velocity and acceleration, and using a Newton dynamic equation to calculate the real-time impedance of the load; and analyzing the calculated impedance of the load, thereby obtaining the mechanical impedance matching therewith and the target stiffness corresponding thereto, and finding a solution to the inverse model from the Young's modulus of the Terfenol-D material to the bias magnetic field, thereby obtaining the level of the bias magnetic field required by the target stiffness, and after the series compensation between the developed inverse model from the Young's modulus of the Terfenol-D material to the bias magnetic field and the magnetostrictive precision transducer is done, further finding the solution to the developed inverse model, thereby obtaining the bias magnetic field and inputting it to the magnetostrictive precision transducer, so that the magnetostrictive precision transducer can change the level of the bias magnetic field by changing the bias current of the DC bias coil, thereby achieving the adaptive matching between the mechanical impedance of the magnetostrictive precision transducer and the impedance of the load.

Implementation of the present invention embodiment provides the following beneficial effects.

In the present invention, the three-layer neural network model of the Young's modulus of the Terfenol-D material is developed and used to analyze the relationship between the stress and the Young's modulus of the Terfenol-D material. Then based on the variation of the Young's modulus, the internal mechanical impedance of the magnetostrictive transducer can be derived using a mechanical impedance method, thereby describing the variation pattern of the elastic modulus of the Terfenol-D material caused by the interaction between the magnetic field and the stress field more precisely. With this information, the internal mechanical impedance precisely matching the impedance of the load can be determined. Then the matching control network of the mechanical impedance of the magnetostrictive precision transducer can be developed. By inverting the three-layer neural network model of the Young's modulus of the Terfenol-D material, the magnetic field level required by the target stiffness can be determined and input to the magnetostrictive precision transducer, thereby enhancing energy efficiency of the magnetostrictive precision transducer.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

For further illustrating the means and functions by which the present invention achieves the certain objectives, the following description, in conjunction with the accompanying drawings and preferred embodiments, is set forth as below to illustrate the implement, structure, features and effects of the subject matter of the present invention.

Figure 2:
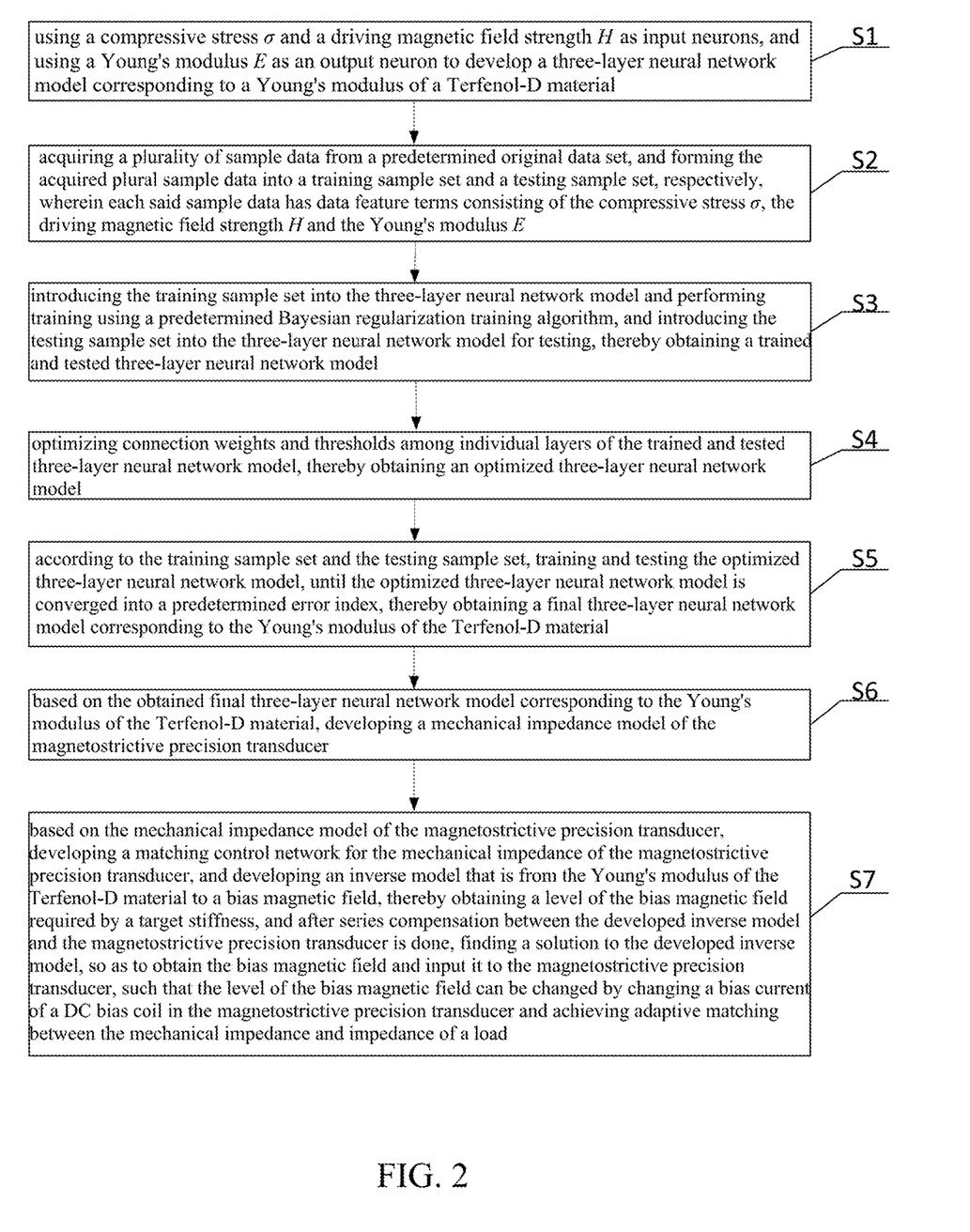
FIG. 2 is a flowchart of a matching control method for mechanical impedance of a magnetostrictive precision transducer according to one embodiment of the present invention.

As shown in FIG. 2, a matching control method for mechanical impedance of a magnetostrictive precision transducer according to one embodiment of the present invention embodiment comprises the following steps S1 through S7.

Step S1 involves using a compressive stress σ and a driving magnetic field strength H as input neurons, and using a Young's modulus E as an output neuron to develop a three-layer neural network model corresponding to a Young's modulus of a Terfenol-D material.

Specifically, for input and output samples, only the compressive stress σ and the driving magnetic field strength H are taken as two input neurons and the Young's modulus E is taken as the output neuron. Thus, the input layer has two neurons and the output layer has one neuron. The effects and functions of the individual layers of the three-layer neural network model are described below.

The input layer serves to analyze input signals before the signals are input to the hidden layer.

The hidden layer receives the signals from the input layer, and performs linear combination operation and non-linear activation function operation on the signals before inputting them into the output layer.

The output layer receives the signals from the hidden layer, and performs linear combination operation on the signals, thereby obtaining output signals. Transfer between the layers is done using transfer functions of tansig and purelin, respectively. The mapping relationship of the input and output functions may be represented by:

$E = f(\sigma, H);$

The number of neurons in the hidden layer is initially determined using empirical equation:

$r = \sqrt{t+s} + a;$ where r is the number of neurons in the hidden layer, s is the number of neurons in the input layer, t is the number of neurons in the output layer, and a is a constant ranging between 0-10. Herein, the number of neurons in the hidden layer is 10.

Step S2 involves acquiring a plurality of sample data from a predetermined original data set, and forming the acquired plural sample data into a training sample set and a testing sample set, respectively, wherein each said sample data has data feature terms consisting of the compressive stress σ, the driving magnetic field strength H and the Young's modulus E.

Specifically, the quality and quantity of sample data have great influence on generalization ability of a neural network. The selected sample data have to be representative and able to reflect overall characteristics of the original data set. In one example, 1495 sets of data were selected for development and verification of the model. Some data are shown in Table 1 below:

TABLE 1

| Compressive Stress Mpa | Driving Magnetic Field Strength KA/m | Young's Modulus Gpa |
|---|---|---|
| −85.9 | 193.2 | 29.1 |
| −83.4 | 193.2 | 28 |
| −75.6 | 177.1 | 25.4 |
| −73.6 | 177.1 | 22.5 |
| −30.7 | 128.8 | 44.2 |
| −28.2 | 128.8 | 46.2 |

In this example, 70% of the experimental data was selected and used as the training data. These data were presented to the network during training. Then the model was adjusted according to errors seen in the network. 15% of the samples was used as verification data. These data were used to measure generalization of the network, so that training was stopped when generalization showed no more improvement. Another 15% of the sample was used as testing data. These data had no influence on the training. Instead, they provided an independent measurement network, for evaluation of the model's performance during and after the training.

Step S3 involves introducing the training sample set into the three-layer neural network model and performing training using a predetermined Bayesian regularization training algorithm, and introducing the testing sample set into the three-layer neural network model for testing, thereby obtaining a trained and tested three-layer neural network model.

Specifically, a Bayesian regularization training algorithm may be used, as this algorithm can lead to good generalization especially for data sets that are difficult, complicated or noisy. The regularization method improves generalization ability of a neural network by correcting the training performance function of the neural network. The training performance function of a neural network is typically the mean-square error function $E_D$, i.e.:

$$E_D = \frac{1}{N} \sum_{i=1}^{N} (e_i)^2$$

In this regularization method, the square and mean of the network weight value are added to the typical target function, and thereby the network performance function is changed into the form below:

$$E = \zeta_1 E_D + \zeta_2 E_W$$

$$E_W = \frac{1}{N} \sum_{j=1}^{N} W_j^2$$

where $\zeta_1$ and $\zeta_2$ are control parameters. If $\zeta_1 \gg \zeta_2$, the training process is focused on decrease of errors in the network. On the contrary, if $\zeta_1 \ll \zeta_2$, the training process is focused on decrease of the weight values to eventually make the output of the neural network more smooth, thus preventing occurrence of a minimal point throughout the training process.

By using the new performance index function E, it is ensured that the network has a relatively low weight value with minimal network training errors. This in fact means that the network is automatically scaled down. In the conventional regularization methods, it is difficult to determine the magnitude of the scale coefficients $\zeta_1$ and $\zeta_2$ whereas the Bayesian regularization method adjusts the weight value and threshold of the network according to the Levenberg-Marquardt theory, and adaptively modulates the magnitude of the target function parameters $\zeta_1$ and $\zeta_2$ during network training.

Step S4 involves optimizing connection weights and thresholds among individual layers of the trained and tested three-layer neural network model, thereby obtaining an optimized three-layer neural network model.

Specifically, each of the layers in the neural network model has its own connection weight and threshold. Selection of these parameters has influence on the operational result of the model. Meanwhile, selection of the number of neurons also has influence on the output of the model. Optimization of the model is principally achieved by optimizing the thresholds and connection weights of the individual layers, adjusting the number of neurons, and decreasing global errors. In one example of the present invention, the optimal number of the neurons in the hidden layer was determined as 20 using the trial-and-error method, and correction of the connection weights and thresholds was achieved using the scheme described below.

As a first step, an input vector P and a target output vector B are set as:

$$\begin{cases} P = (P_1, P_2 \lfloor P_m) = (\sigma_1, \sigma_2 \lfloor \sigma_m, H_1, H_2 \lfloor H_m) \\ B = (E_1, E_2 \lfloor E_m) \end{cases} \quad (1)$$

where $P_i = (\sigma_i, H_i)$, $i=1, \ldots, m$;

Then, any group of said data is selected and used as a sample input network, so that an input vector and an output vector of a hidden layer can be represented by:

$$\begin{cases} \alpha = (\alpha_1, \alpha_2 \lfloor \alpha_n) \\ \beta = (\beta_1, \beta_2 \lfloor \beta_n) \\ \alpha_j = \sum_{i=1}^{m} w_{ij} P_i - \theta_i \quad i = 1, 2, \lfloor m; j = 1, 2, \lfloor n \\ \beta_j = f(\alpha_j) \end{cases} \quad (2)$$

where $\alpha$ is the input vector of the hidden layer, $\beta$ is the output vector of the hidden layer, $f$ is a transfer function from the input layer to the hidden layer, $w_{ij}$ is a connection weight from the input layer to the hidden layer, and $\theta_j$ is a threshold of the hidden layer.

Afterward, from the output vector of the hidden layer, an input vector and an output vector of the output layer are obtained as:

$$\begin{cases} \chi = (\chi_1, \chi_2 \lfloor \chi_n) \\ \delta = (\delta_1, \delta_2 \lfloor \delta_n) \\ \chi_t = \sum_{i=1}^{m} v_{jt} \beta_j - \gamma_t \quad t = 1, 2, \lfloor m \\ \delta_t = L(\chi_t) \end{cases} \quad (3)$$

where $\chi$ is the input vector of the output layer, $\delta$ is the output vector of the output layer, L is a transfer function from the hidden layer to the output layer, $v_{jt}$ is a connection weight from the hidden layer to the output layer, and $\gamma_t$ is a threshold of the output layer.

Next, an error of each unit of the output layer and the hidden layer are determined as:

$$\begin{cases} d_t = (E_t - \delta_t) \delta_t (1 - \delta_t) \\ e_j = \left[\sum_{t=1}^{m} d_t v_{jt}\right] \beta_j (1 - \beta_j) \end{cases} \quad (4)$$

where $d_t$ is an error of the output layer, and $e_j$ is an error of the hidden layer.

At last, according to Equation (5), the thresholds and the connection weights of the hidden layer and the output layer are corrected, until a global error is smaller than a set value, thereby obtaining the optimized three-layer neural network model;

$$\begin{cases} v_{jt}(N+1) = v_{jt}(N) + \lambda d_t \beta_j \\ \gamma_t(N+1) = \gamma_t(N) + \lambda d_t \end{cases} \quad (5)$$

-continued
$$\begin{cases} w_{ij}(N+l) = w_{ij}(N) + \Delta w_{ij}(N) \\ \theta_j(N+1) = \theta_j(N) + \Delta \theta_j(N) \end{cases};$$

where $\Delta w_{ij}$ is a variation of the weight of the hidden layer, $\Delta \theta_j$ is a variation of the threshold of the hidden layer, and $\lambda$ is an error coefficient, $0<\lambda<1$.

The connection weights and thresholds of the individual layers are modulated in this way until the global error becomes smaller than a set value, which means the neural network model satisfies the target requirement, thereby obtaining the optimized three-layer neural network model.

Step S5 involves according to the training sample set and the testing sample set, training and testing the optimized three-layer neural network model, until the optimized three-layer neural network model is converged into a predetermined error index, thereby obtaining a final three-layer neural network model corresponding to the Young's modulus of the Terfenol-D material.

Specifically, the model is trained again using the stress $\sigma$ and magnetic field strength H as inputs and the Young's modulus E as an output. In one example, the model was converged to the required error index after 1000 iterations.

Figure 3:
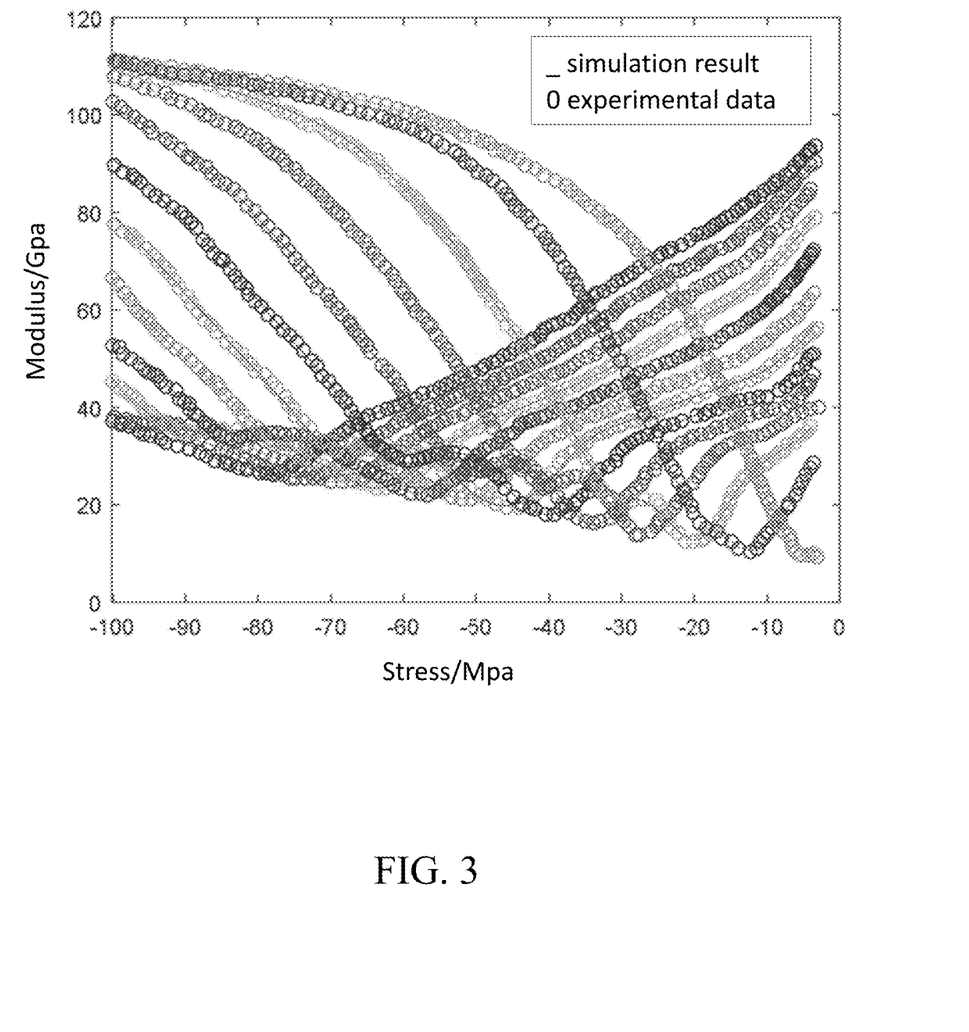
FIG. 3 is a graph showing comparison between the Young's modulus of the Terfenol-D from a model trained in an application scenario of the matching control method for mechanical impedance of a magnetostrictive precision transducer according to the embodiment of the present invention and the actual value.

Further, in the example, the experimental data and the simulation results of the neural network model were compared. The comparative results and errors are shown in FIG. 3.

Figure 4:
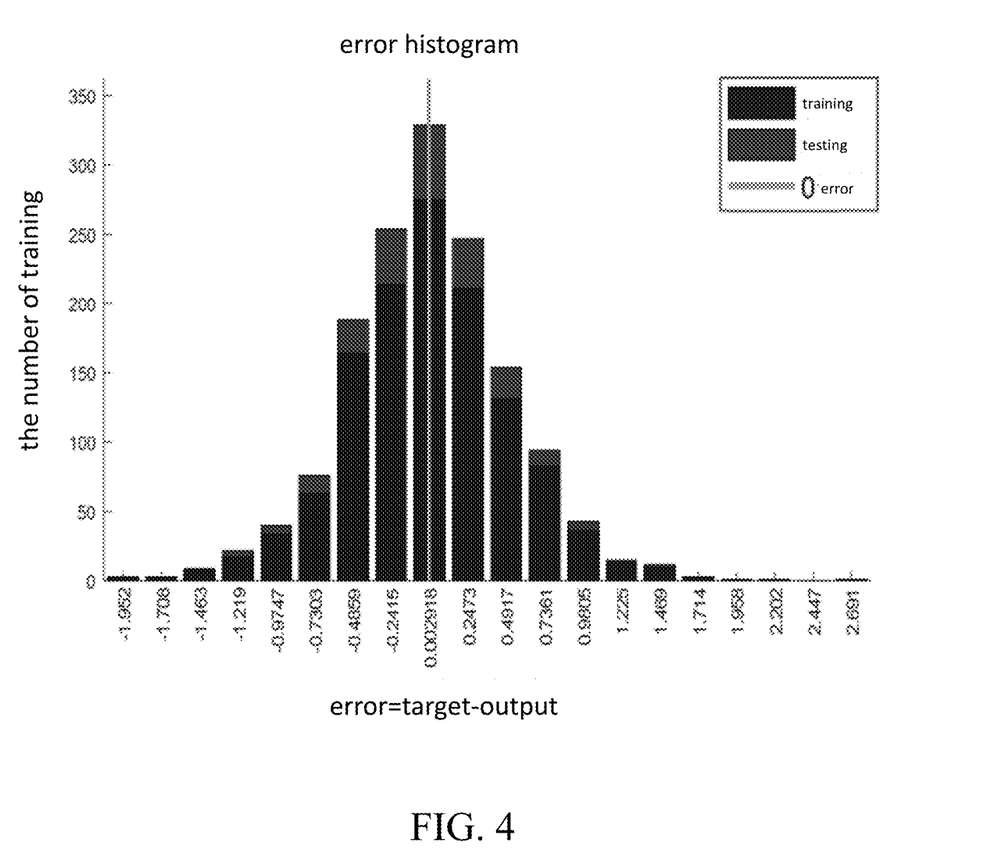
FIG. 4 is an error histogram showing comparison between the Young's modulus of the Terfenol-D from a model trained in an application scenario of the matching control method for mechanical impedance of a magnetostrictive precision transducer according to the embodiment of the present invention and the actual value.

As proven in the comparison, the developed neural network model was able to better forecast the Young's modulus of Terfenol-D under different levels of strength of the bias magnetic field, so the model can be used to calculate the material's Young's modulus under arbitrary settings of the bias magnetic field $H_i$ and the stress, as shown in FIG. 4.

Step S6 involves based on the obtained final three-layer neural network model corresponding to the Young's modulus of the Terfenol-D material, developing a mechanical impedance model of the magnetostrictive precision transducer.

Figure 5:
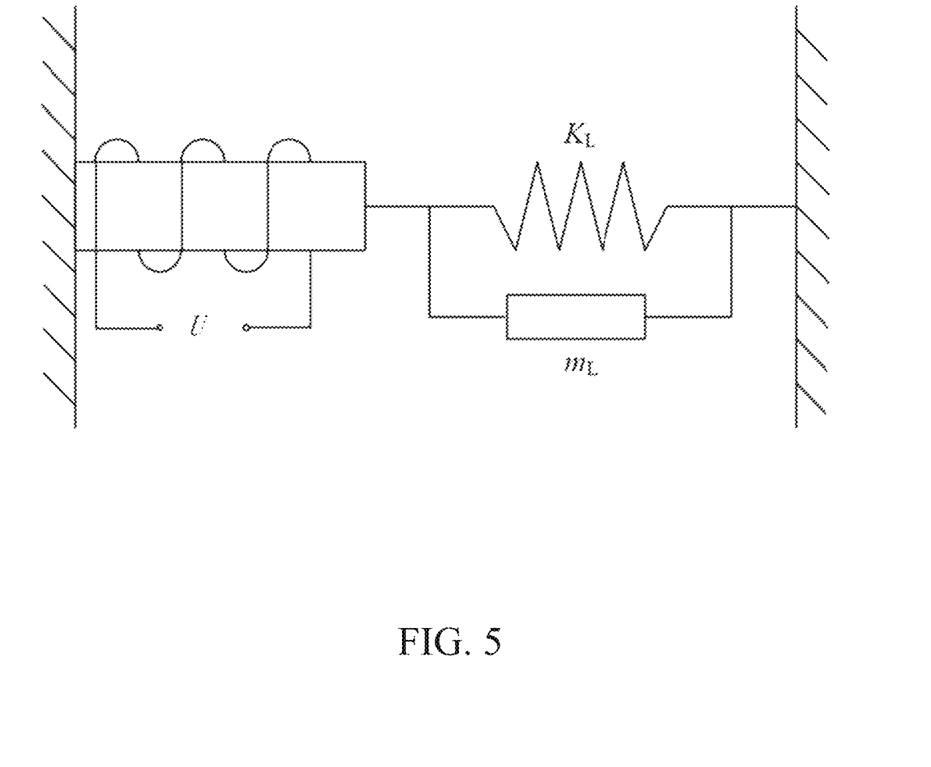
FIG. 5 is a schematic diagram of a dynamic model of the magnetostrictive precision transducer in an application scenario of the matching control method for mechanical impedance of a magnetostrictive precision transducer according to the embodiment of the present invention.
Figure 6:
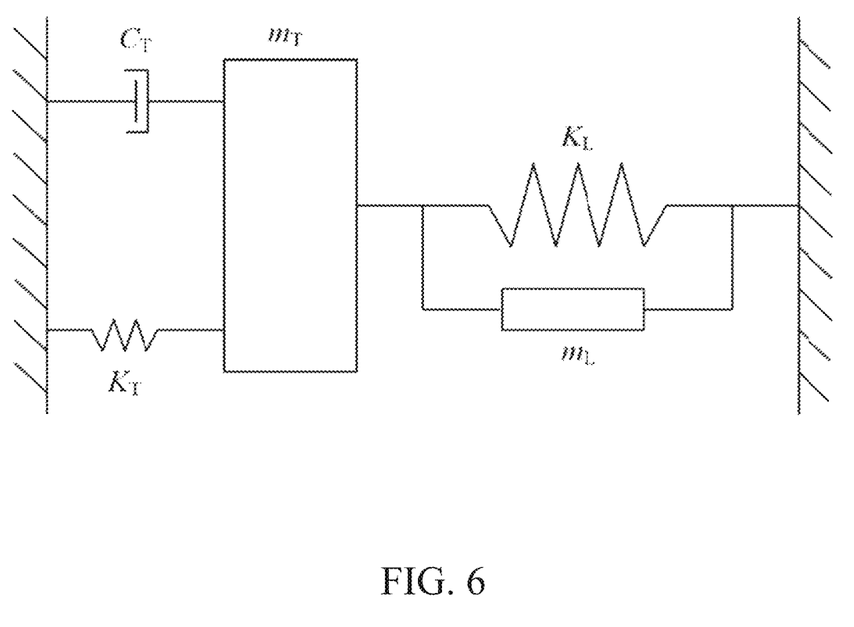
FIG. 6 is a schematic diagram of a single-DoF dynamic model of the magnetostrictive precision transducer in an application scenario of the matching control method according to the embodiment of the present invention.

Specifically, according to the structure of individual components in the magnetostrictive precision transducer (as shown in FIG. 5), the single-DoF dynamic model of the magnetostrictive precision transducer is determined, as shown in FIG. 6. In FIG. 6, with consideration to the structure of individual components in the magnetostrictive precision transducer, the equivalent mass of the Terfenol-D rod is set as $m_T$, the equivalent stiffness is set as $K_T$, the load is regarded as the elastic mass load, the equivalent stiffness is $K_L$, and the mass is $m_L$.

Figure 7:
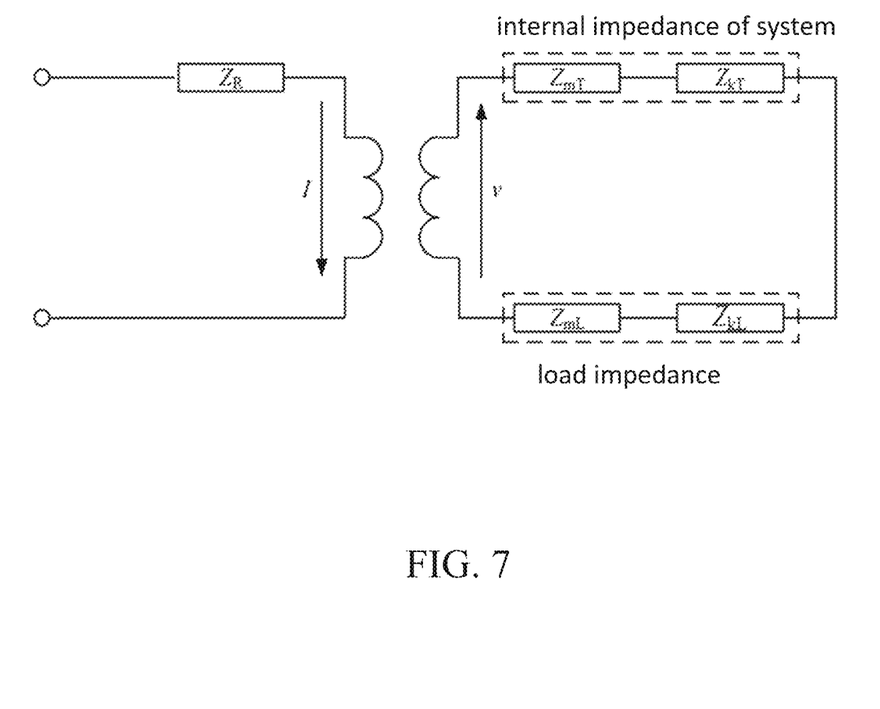
FIG. 7 is a schematic diagram of the magnetostrictive precision transducer in an application scenario of the matching control method according to the embodiment of the present invention.

Based on the single-DoF dynamic model of the magnetostrictive precision transducer, the mechanical impedance network of the magnetostrictive precision transducer is determined, as shown in FIG. 7. Therein, since the damping in the single-DoF dynamic model of the magnetostrictive precision transducer as shown in FIG. 6 is such small that it can be ignored, the mechanical impedance network of the magnetostrictive precision transducer can be obtained as shown in FIG. 7.

Based on the obtained final three-layer neural network model corresponding to the Young's modulus of the Terfenol-D material and the mechanical impedance network of the magnetostrictive precision transducer, the mechanical impedance method is used to obtain the mechanical impedance model of the magnetostrictive precision transducer.

Therein, the models of the components in FIG. 7 may be represented by Equation (6):

$$\begin{cases} Z_{mT} = j\omega m_T \\ Z_{kT} = k_T / j\omega \\ Z_{mL} = j\omega m_L \\ Z_{kL} = k_L / j\omega \end{cases} \quad (6)$$

According to the Kirchhoff laws, the internal impedance of the system is $Z_i = Z_{mT} + Z_{kT} = (m_T\omega - K_T/\omega)j$, and the load impedance is $Z_L = (m_L\omega - K_L/\omega)j$. The total impedance of the entire system is $Z = (m_T\omega - K_T/\omega + m_L\omega - K_L/\omega)j$.

However, the equivalent mass $m_T$ of the Terfenol-D rod in Equation (6) may be represented by Equation (7):

$$m_T = \rho V = \frac{\pi d^2 L \rho}{4}; \quad (7)$$

where the density of the Terfenol-D rod is $\rho$, its length is L, and its diameter is d.

The equivalent stiffness $K_T$ of the Terfenol-D rod in Equation (6) may be represented by Equation (8):

$$K_T = EA/L = \frac{\pi d^2 E}{4L} \quad (8)$$

Accordingly, based on the final three-layer neural network model of the Young's modulus of the Terfenol-D material, combined with Equations (6)-(8), the mechanical impedance model of the magnetostrictive precision transducer can be obtained.

Step S7 involves based on the mechanical impedance model of the magnetostrictive precision transducer, developing a matching control network for the mechanical impedance of the magnetostrictive precision transducer, and developing an inverse model that is from the Young's modulus of the Terfenol-D material to a bias magnetic field, thereby obtaining a level of the bias magnetic field required by a target stiffness, and after series compensation between the developed inverse model and the magnetostrictive precision transducer is done, finding a solution to the developed inverse model, so as to obtain the bias magnetic field and input it to the magnetostrictive precision transducer, such that the level of the bias magnetic field can be changed by changing a bias current of a DC bias coil in the magnetostrictive precision transducer and achieving adaptive matching between the mechanical impedance and impedance of a load.

Specifically, based on the final three-layer neural network model corresponding to the Young's modulus of the Terfenol-D material obtained in Step S5, the inverse model from the Young's modulus of the Terfenol-D material to the bias magnetic field is developed.

Based on the mechanical impedance of the magnetostrictive precision transducer calculated in Step S6, the mechanical impedance matching control network is designed. As shown in the flowchart of mechanical impedance tracking control of the magnetostrictive precision transducer in FIG. 8, the current internal impedance of the system is used as the initial value of a mechanical impedance matching controller. After the control process starts, the initial value is continuously updated and replaced in a real-time manner according to the feedback provided by a mechanical load recognition unit. The mechanical load recognition unit uses sensors to acquire signals related to movements of the load such as displacement, velocity and acceleration, and uses the Newton dynamic equation to calculate the real-time load impedance.

Figure 8:
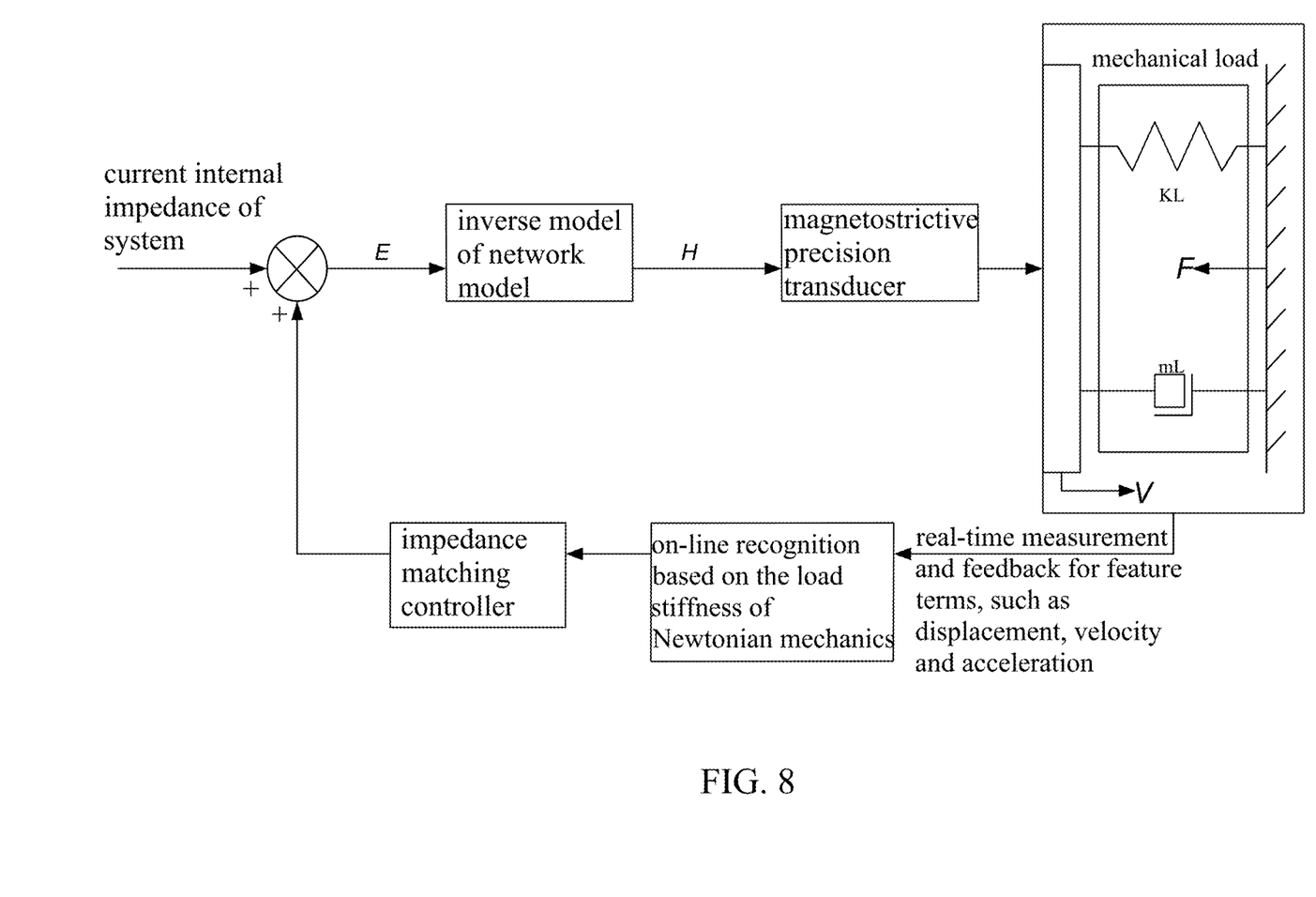
FIG. 8 is a flowchart of tracking control of mechanical impedance of the magnetostrictive precision transducer in an application scenario of the matching control method according to the embodiment of the present invention.

On this basis, the load impedance is first analyzed, thereby obtaining the system internal impedance matching therewith and the target stiffness corresponding thereto. Next, by finding a solution to the inverse model from the Young's modulus of the Terfenol-D material to the bias magnetic field, the level of the bias magnetic field required by the target stiffness is determined. At last, after the series compensation between the developed inverse model from the Young's modulus of the Terfenol-D material to the bias magnetic field and the magnetostrictive precision transducer is done, the solution to the inverse model is found, so as to obtain the bias magnetic field and input it to the magnetostrictive precision transducer. This enables the magnetostrictive precision transducer to change the level of the bias magnetic field by changing the bias current in the DC bias coil, thereby achieving adaptive matching between the mechanical impedance and the load impedance, and improving energy efficiency. In other words, by actively modulating the internal mechanical impedance of the transducer adaptive matching with the load impedance is realized.

In FIG. 8, the neural network model is inverted through the following process: developing an inverse model from the Young's modulus of the Terfenol-D material to the bias magnetic field, obtaining the target impedance from the mechanical impedance matching controller, finding the value of the Young's modulus corresponding to the target impedance, and using the current value of the Young's modulus as the input signal for calculation in the inverse model, thereby obtaining the corresponding bias magnetic field H. The bias magnetic field is then used as the control signal and applied to the magnetostrictive precision transducer to eventually make the internal mechanical impedance of the transducer match with the mechanical impedance of the load, thereby completing matching control with respect to the mechanical impedance of the load.

In order to verify the effectiveness of the disclosed load mechanical impedance closed-loop tracking control method, in one example, comparison about energy conversion efficiency was conducted between the control scheme with variable internal impedance approach and the control scheme with fixed internal impedance. Three levels of stiffness $K_T$, of the Terfenol-D material were selected, namely Level I as $8 \times 10^6$ (N/m), Level II as $2 \times 10^7$ (N/m) and Level III as $3 \times 10^7$ (N/m). For energy conversion efficiency analysis of the transducer, the load stiffness $K_L$ was taken as the independent variable, and the energy conversion efficiency $\eta$ of the transducer was taken as the dependent variable, from which curves describing the relationship between the energy conversion efficiency and the load stiffness were plotted. The comparative results are shown in FIG. 9.

Figure 9:
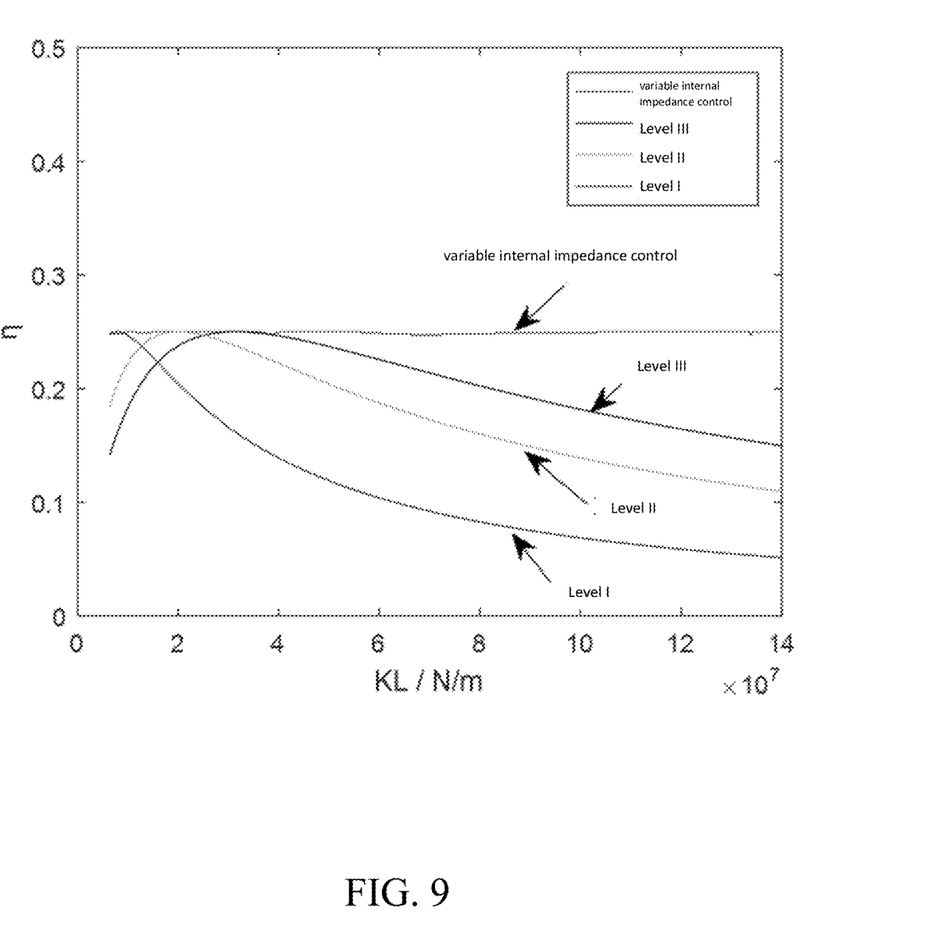
FIG. 9 is a comparative graph showing energy conversion efficiency of the magnetostrictive precision transducer changing with the stiffness of the load in an application scenario of the matching control method according to the embodiment of the present invention with the internal mechanical impedance of the transducer controlled and not controlled.

As shown in FIG. 9, with the internal impedance of the system remained unchanged, as the load stiffness continuously changed, the value of power conversion efficiency $\eta$ always fluctuated between 0.05 and 0.25. With the internal impedance modulated, the value $\eta$ always fluctuated between 0.25 and 0.23. This demonstrates that modulation of the internal impedance significantly improved the output power of the magnetostrictive precision transducer.

In one example where the load mass $m_L$ is an independent variable and the power conversion efficiency η of the transducer is a dependent variable, three levels of the stiffness $K_T$ of the Terfenol-D material were select, namely Level I as $5 \times 10^7$ (N/m), Level II as $7 \times 10^7$ (N/m) and Level III as $8 \times 10^7$ (N/m) (N/m). Curves describing the relationship between the energy conversion efficiency and the load mass were plotted. The comparative results are shown in FIG. 10.

Figure 10:
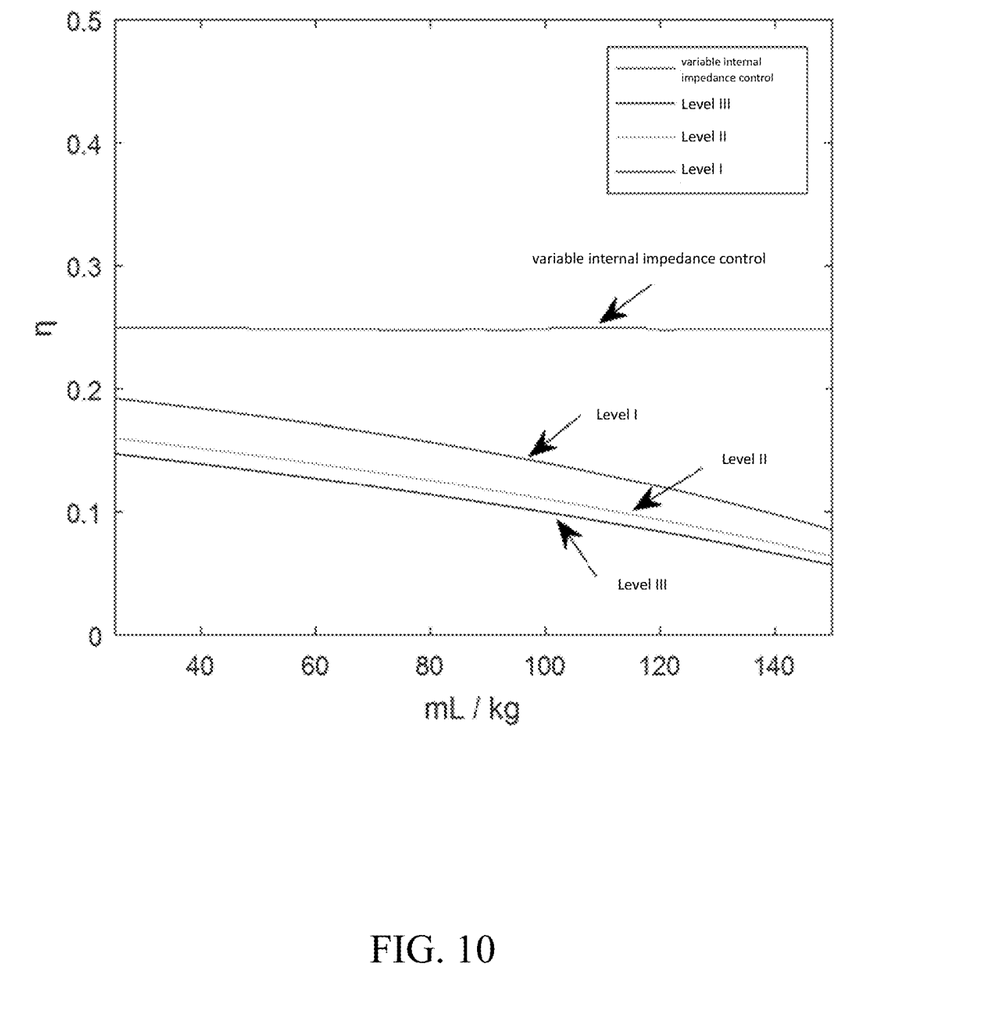
FIG. 10 is a comparative graph showing energy conversion efficiency of the magnetostrictive precision transducer changing with the mass of the load in an application scenario of the matching control method according to the embodiment of the present invention with the internal mechanical impedance of the transducer controlled and not controlled.

As shown in FIG. 10, with the internal mechanical impedance of the transducer not controlled, as the load mass continuously changed, the value of the energy conversion efficiency η of the transducer always fluctuated between 0.1 and 0.2. After tracking control was performed on the internal mechanical impedance of the transducer, the value of its energy conversion efficiency η fluctuated between 0.25 and 0.24, meaning that the energy power of the magnetostrictive precision transducer was significantly increased, and this proved that the disclosed matching control method for mechanical impedance of a magnetostrictive precision transducer is feasible and effective.

Implementation of the present invention embodiment provides the following beneficial effects.

In the present invention, the three-layer neural network model of the Young's modulus of the Terfenol-D material is developed and used to analyze the relationship between the stress and the Young's modulus of the Terfenol-D material. Then based on the variation of the Young's modulus, the internal mechanical impedance of the magnetostrictive transducer can be derived using a mechanical impedance method, thereby describing the variation pattern of the elastic modulus of the Terfenol-D material caused by the interaction between the magnetic field and the stress field more precisely. With this information, the internal mechanical impedance precisely matching the impedance of the load can be determined. Then the matching control network of the mechanical impedance of the magnetostrictive precision transducer can be developed. By inverting the three-layer neural network model of the Young's modulus of the Terfenol-D material, the magnetic field level required by the target stiffness can be determined and input to the magnetostrictive precision transducer, thereby enhancing energy efficiency of the magnetostrictive precision transducer.

People of ordinary skill in the art should understand that the method as described in the foregoing embodiment may be entirely or partially implemented by using a program to instruct related hardware, and the program may be stored in a computer-readable storage medium, such as a ROM/RAM, a magnetic disk to or an optical disk.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A matching control method for mechanical impedance of a magnetostrictive precision transducer, the method comprising steps of:

Step S1: using a compressive stress σ and a driving magnetic field strength H as input neurons, and using a Young's modulus E as an output neuron to develop a three-layer neural network model corresponding to a Young's modulus of a Terfenol-D material;

Step S2: acquiring a plurality of sample data from a predetermined original data set, and forming the acquired plural sample data into a training sample set and a testing sample set, respectively, wherein each said sample data has data feature terms consisting of the compressive stress σ, the driving magnetic field strength H and the Young's modulus E;

Step S3, introducing the training sample set into the three-layer neural network model and performing training using a predetermined Bayesian regularization training algorithm, and introducing the testing sample set into the three-layer neural network model for testing, thereby obtaining a trained and tested three-layer neural network model;

Step S4, optimizing connection weights and thresholds among individual layers of the trained and tested three-layer neural network model, thereby obtaining an optimized three-layer neural network model;

Step S5, according to the training sample set and the testing sample set, training and testing the optimized three-layer neural network model, until the optimized three-layer neural network model is converged into a predetermined error index, thereby obtaining a final three-layer neural network model corresponding to the Young's modulus of the Terfenol-D material;

Step S6, based on the obtained final three-layer neural network model corresponding to the Young's modulus of the Terfenol-D material, developing a mechanical impedance model of the magnetostrictive precision transducer; and Step S7, based on the mechanical impedance model of the magnetostrictive precision transducer, developing a matching control network for the mechanical impedance of the magnetostrictive precision transducer, and developing an inverse model that is from the Young's modulus of the Terfenol-D material to a bias magnetic field, thereby obtaining a level of the bias magnetic field required by a target stiffness, and after series compensation between the developed inverse model and the magnetostrictive precision transducer is done, finding a solution to the developed inverse model, so as to obtain the bias magnetic field and input it to the magnetostrictive precision transducer, such that the level of the bias magnetic field can be changed by changing a bias current of a DC bias coil in the magnetostrictive precision transducer and achieving adaptive matching between the mechanical impedance and impedance of a load.

2. The matching control method of claim 1, wherein the Step S4 comprises:

setting an input vector P and a target output vector B as:

$$\begin{cases} P = (P_1, P_2 \lfloor P_m) = (\sigma_1, \sigma_2 \lfloor \sigma_m, H_1, H_2 \lfloor H_m) \\ B = (E_1, E_2 \lfloor E_m) \end{cases} \quad (1)$$

where $P_i = (\sigma_i, H_i)$, i=1, ..., m;

is selecting any group of said data as a sample input network, so that an input vector and an output vector of a hidden layer can be represented by:

$$\begin{cases} \alpha = (\alpha_1, \alpha_2 \lfloor \alpha_n) \\ \beta = (\beta_1, \beta_2 \lfloor \beta_n) \\ \alpha_j = \sum_{i=1}^{m} w_{ij} P_i - \theta_i \quad i = 1, 2, \lfloor m; j = 1, 2, \lfloor n \\ \beta_j = f(\alpha_j) \end{cases} \quad (2)$$

where $\alpha$ is the input vector of the hidden layer, $\beta$ is the output vector of the hidden layer, $f$ is a transfer function from the input layer to the hidden layer, $w_{ij}$ is a connection weight from the input layer to the hidden layer, and $\theta_j$ is a threshold of the hidden layer;

then from the output vector of the hidden layer, obtaining an input vector and an output vector of an output layer as:

$$\begin{cases} \chi = (\chi_1, \chi_2 \lfloor \chi_n) \\ \delta = (\delta_1, \delta_2 \lfloor \delta_n) \\ \chi_t = \sum_{i=1}^{m} v_{jt} \beta_j - \gamma_t \quad t = 1, 2, \lfloor m \\ \delta_t = L(\chi_t) \end{cases} \quad (3)$$

where $\chi$ is the input vector of the output layer, $\delta$ is the output vector of the output layer, L is a transfer function from the hidden layer to the output layer, $v_{jt}$ is a connection weight from the hidden layer to the output layer, and $\gamma_t$ is a threshold of the output layer;

next, determining an error of each unit of the output layer and the hidden layer as:

$$\begin{cases} d_t = (E_t - \delta_t)\delta_t(1 - \delta_t) \\ e_j = \left[\sum_{t=1}^{m} d_t v_{jt}\right] \beta_j (1 - \beta_j) \end{cases} \quad (4)$$

where $d_t$ is an error of the output layer, and $e_j$ is an error of the hidden layer; and at last, according to Equation (5), correcting the thresholds and the connection weights of the hidden layer and the output layer, until a global error is smaller than a set value, thereby obtaining the optimized three-layer neural network model;

$$\begin{cases} v_{jt}(N+1) = v_{jt}(N) + \lambda d_t \beta_j \\ \gamma_t(N+1) = \gamma_t(N) + \lambda d_t \end{cases} \quad (5)$$

$$\begin{cases} w_{ij}(N+1) = w_{ij}(N) + \Delta w_{ij}(N) \\ \theta_j(N+1) = \theta_j(N) + \Delta \theta_j(N) \end{cases};$$

where $\Delta w_{ij}$ is a variation of the weight of the hidden layer, $\Delta \theta_j$ is a variation of the threshold of the hidden layer, and $\lambda$ is an error coefficient, $0 < \lambda < 1$.

3. The matching control method of claim 1, wherein the Step S6 comprises:
according to a structure of individual components in the magnetostrictive precision transducer, determining a single-DoF dynamic model of the magnetostrictive precision transducer;
based on the single-DoF dynamic model of the magnetostrictive precision transducer, determining a mechanical impedance network of the magnetostrictive precision transducer; and
based on the obtained final three-layer neural network model corresponding to the Young's modulus of the Terfenol-D material and the mechanical impedance network of the magnetostrictive precision transducer, using a mechanical impedance method to obtain the mechanical impedance model of the magnetostrictive precision transducer.

4. The matching control method of claim 1, wherein the Step S7 comprises:
based on the obtained final three-layer neural network model corresponding to the Young's modulus of the Terfenol-D material, developing the inverse model from the Young's modulus of the Terfenol-D material to the bias magnetic field;
based on the mechanical impedance model of the magnetostrictive precision transducer, developing the matching control network for the mechanical impedance of the magnetostrictive precision transducer, and using sensors to acquire signals related to movements of the load such as displacement, velocity and acceleration, and using a Newton dynamic equation to calculate the real-time impedance of the load; and
analyzing the calculated impedance of the load, thereby obtaining the mechanical impedance matching therewith and the target stiffness corresponding thereto, and finding a solution to the inverse model from the Young's modulus of the Terfenol-D material to the bias magnetic field, thereby obtaining the level of the bias magnetic field required by the target stiffness, and after the series compensation between the developed inverse model from the Young's modulus of the Terfenol-D material to the bias magnetic field and the magnetostrictive precision transducer is done, further finding the solution to the developed inverse model, thereby obtaining the bias magnetic field and inputting it to the magnetostrictive precision transducer, so that the magnetostrictive precision transducer can change the level of the bias magnetic field by changing the bias current of the DC bias coil, thereby achieving the adaptive matching between the mechanical impedance of the magnetostrictive precision transducer and the impedance of the load.

\* \* \* \* \*